United States Patent
Ito et al.

(10) Patent No.: US 6,573,607 B2
(45) Date of Patent: Jun. 3, 2003

(54) SEMICONDUCTOR DEVICE AND MANUFACTURING METHOD THEREOF

(75) Inventors: Nobukazu Ito, Tokyo (JP); Yoshihisa Matsubara, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 82 days.

(21) Appl. No.: 09/939,396

(22) Filed: Aug. 24, 2001

(65) Prior Publication Data

US 2002/0005587 A1 Jan. 17, 2002

Related U.S. Application Data

(62) Division of application No. 09/385,756, filed on Aug. 30, 1999, now Pat. No. 6,309,970.

(30) Foreign Application Priority Data

Aug. 31, 1998 (JP) .............................. 10-245684

(51) Int. Cl.[7] .............................................. H01L 23/48
(52) U.S. Cl. ..................... 257/762; 257/635; 257/758; 257/753; 257/752; 438/687; 438/618; 438/622; 438/635; 438/636; 438/672
(58) Field of Search .................. 257/762, 635, 257/758, 753, 752; 458/687, 618, 622, 635, 136, 672, 637

(56) References Cited

U.S. PATENT DOCUMENTS 5,766,379 A    6/1998  Lanford et al.
5,968,333 A  * 10/1999  Nogami et al. ............. 205/184
5,985,762 A  * 11/1999  Geffken et al. ............. 438/687
6,037,250 A  *  3/2000  Matsubara ................... 438/622
6,037,257 A  *  3/2000  Chiang et al. ............... 438/687
6,071,813 A  *  6/2000  Nogami ...................... 438/687
6,100,190 A  *  8/2000  Kobori ........................ 438/659
6,177,347 B1 *  1/2001  Liu et al. .................... 438/675

FOREIGN PATENT DOCUMENTS

DE   196 27 017 A1   7/1996
EP   0 518 774 A1    6/1992
JP   5-198559         8/1993
JP   9-64033          3/1997
JP   9-69519          3/1997

OTHER PUBLICATIONS

Venkatesan, S. et al., "A High Performance 1.8V, 0.20 μm CMOS Technology with Copper Metallization", 1997 IEEE, Advanced Products Research and Development Laboratory, Motorola, Austin, TX.

* cited by examiner

Primary Examiner—Matthew Smith
Assistant Examiner—Belur V Keshavan
(74) Attorney, Agent, or Firm—Choate, Hall & Stewart

(57) ABSTRACT

There is presented a semiconductor device including multiple levels of copper interconnects; wherein the surface of a copper interconnect corresponding to at least one underlying layer of another copper interconnect layer is turned into copper oxide to a thickness of 30 nm or more by oxidation conducted at the oxidation rate of 20 nm/min or less, and thereby the reflection of the exposure light from the lower-level copper interconnect is prevented, in forming by means of photolithography a trench to form a copper interconnect through damascening.

12 Claims, 6 Drawing Sheets

(Transmission Light = 100%)

SEMICONDUCTOR DEVICE AND MANUFACTURING METHOD THEREOF

CROSS REFERENCE TO RELATED APPLICATIONS

This application is a divisional of U.S. patent application Ser. No. 09/385,756 which was filed on Aug. 30, 1999, now U.S. Pat. No. 6,309,970.

BACKGROUND OF THE INVENTION

1. Field of the Invention

The present invention relates to a semiconductor device such as an LSI device and a manufacturing method thereof. More particularly, the present invention relates to a semiconductor device with multiple levels of metal interconnects in which copper trench interconnects are used and a manufacturing method thereof.

2. Description of the Related Art

In recent years, the increase in high-speed operation and increased integration in the LSI device have proceeded, and there have arisen demands that further miniaturization and more densely spaced arrangement should be attained not only in the transistor but also in the interconnect.

As a metal interconnect material, mainly Al is utilized, hitherto, but this is known to lead to a problem of electromigration (EM); that is, a temperature rise due to an increase in current density of the interconnect and a heat generated by the whole device causes some metal atoms within an interconnect layer to move, which creates voids in some parts from which those atoms move out and may thereby bring about the severance of the interconnect. Further, in some parts where metal atoms are accumulated, grains called hillocks are formed and, cause stress on a dielectric layer lying over the interconnect, these may cause cracks.

To solve such problems, the use of an alloy in which a very small amount of Si or Cu is mixed with Al is proposed, but even this will become insufficient if attempts to attain further miniaturization and more densely spaced arrangement advance, and, therefore, the use of the copper interconnect which has a still higher reliability is under consideration.

Among metal materials, copper has the second lowest resistivity to silver (1.7 to 1.8 $\mu\Omega$-cm, as against 3.1 $\mu\Omega$-cm for AlCu) as well as an excellent EM reliability. Consequently, amidst the advance in achieving a still more densely spaced arrangement, establishment of novel techniques making use of these copper characteristics is very much sought after.

For instance, techniques wherein copper is employed as an interconnect material are disclosed in an article titled "*A High Performance 1.8 V, 0.20 $\mu$m CMOS Technology with Copper Metallization*" in IEDM (International Electron Devices Meeting) '97, pp. 769–772, and an article titled "*Full Copper Wiring in a Sub-0.25 $\mu$m CMOS ULSI Technology*" in IEDM '97, pp. 773–776.

Copper is a relatively difficult material to have a pattern formed therefor by etching. Especially, in the application to a semiconductor device of sub-0.25 $\mu$m order, copper should be formed by the interconnect trench-burying techniques (the damascene metallization techniques).

This is carried out, for example, as shown from FIG. 5(*a*) to FIG. 5(*e*). Firstly, a first interconnect trench (2) is formed on a first interlayer dielectric film (1) (FIG. 5(*a*)), and then a barrier metal layer (3) and copper (4) are grown thereon, in succession, by the electroplating method, the CVD (Chemical Vapour Deposition) method or the like (FIG. 5(*b*)). Subsequently, polishing by the chemical mechanical polishing (CMP) method is applied thereto till the surface of the first interlayer dielectric film (1) is exposed, and, with planarization of the copper surface, a first-level interconnect (5) is accomplished in the form of damascene (FIG. 5(*c*)). In order to form a copper interconnect above this, after a second interlayer dielectric film (7) is grown, a second interconnect trench (9) as well as a via hole (8) for a contact with the first-level interconnect (5) are formed by means of photolithography (FIG. 5(*d*)) and then, by filling with copper in the similar manner, a second-level interconnect (10) is formed (FIG. 5(*e*)).

When the second interconnect trench (9) as well as the via hole (8) are formed in the second interlayer dielectric film (7), reflection from the underlying first-level interconnect (5) during the resist exposure may cause an overexposure and result in a collapse of the resist pattern, which is a serious problem. Especially, in the case that a widely spaced pattern and a closely spaced pattern are mingled due to the device miniaturization, if the exposure is conducted under conditions adjusted to the widely spaced part, the closely spaced part is exposed excessively and this overexposure makes the pattern collapse significantly. On the other hand, if the adjustment of the exposure is made to the closely spaced part, the widely spaced part is underexposed so that the pattern therein is not sufficiently defined. Certainly, it is preferable that every part can be exposed uniformly, and, consequently, formation of an anti-reflective coating (ARC) becomes essential.

As the ARC, the organic ARC of polyimide or the like and the inorganic ARC of Si, SiN, TiN, TiW or the like are known hitherto. In addition, the use of the ARC of SiON has been proposed. In the case of the organic ARC, however, its effect appears only when formed to a thickness of several hundred nm or so and, moreover, with a coating method such as the spin coating method being utilized, it is difficult to form as a flat film. Consequently, the application thereof to a minute device in which copper interconnects are employed is not very feasible. With the ARC such as SiON grown under the condition of the atmosphere containing oxygen, copper may be oxidized. The formed copper oxide film is easily peeled off and, in some cases, a desired ARC cannot be formed. Further, for the nitride ARC, there are problems described below, with reference to FIG. 6. That is, a portion of the nitride film in contact with a lower-level copper interconnect (61) must be removed in a later step of the manufacturing process, and, in that occasion, while etching is applied to both an oxide film (63) and the nitride film (62), etching conditions, being set respectively, must be changed in the middle of the etching step. Furthermore, particularly because the film thickness of the nitride film (62) is uneven in forming, overetching is normally required. This makes a lateral section of the nitride film (62) recede, as shown in FIG. 6(*a*).

Meanwhile, if copper comes into a direct contact with an oxide film, the surface of copper is oxidized when heated in a later step. Further, there is another problem that, if copper diffuses into a substrate through the oxide film, the device properties are led to deteriorate. Accordingly, in a normal practice, a barrier film (TiN, WN or the like) is set between the dielectric film and copper. If the formation of the barrier film is carried out in such a state that the lateral section of the nitride film is receded as described above, however, the barrier film formed by the sputtering method or the like cannot reach the lateral section and the barrier film (64) can be formed only in the shape, for example, as shown in FIG.

6(b). Consequently, if metallization with copper by the ordinary CVD method is performed thereon, copper goes round and comes into a direct contact with the dielectric film, which may give rise to problems described above.

On the other hand, in Japanese Patent Application Laid-open No. 112201/1994, there is disclosed novel techniques in which the upper part of a tungsten interconnect is subjected to oxidation and a tungsten oxide film is formed and said tungsten oxide film serves as an anti-reflective layer. In this case, etching can be carried out in a later step of the etching process, using fluorine gas alone, which is an advantage.

The oxide film of copper, however, has a problem that, generally, it is not very dense and easily peeled off and, hitherto, it was a widely accepted view that copper should be formed so as not to be oxidized.

SUMMARY OF THE INVENTION

The present inventors conducted an investigation to prevent the reflection from the surface of the copper interconnect and successfully found out that the application of oxidation to the surface of the copper interconnect under certain specific conditions, though avoided hitherto, makes it possible to form a copper oxide film having the anti-reflective effect, without impairing the effective cross section of the interconnect, and reached the present invention, which is herein disclosed.

Accordingly, the present invention relates to a semiconductor device including multiple levels of copper interconnects; wherein the surface of a copper interconnect corresponding to at least one underlying layer of another copper interconnect layer is turned into copper oxide to a thickness of 30 nm or more by oxidation conducted at the oxidation rate of 20 nm/min or less.

Further, the present invention relates to a method of manufacturing a semiconductor device including multiple levels of copper interconnects; wherein, in forming a dielectric layer over a copper interconnect and then forming, in said dielectric layer, a trench to form a copper interconnect through damascene metallization technique, and a via hole to bring out a contact with a lower-level copper interconnect, the surface of the lower-level copper interconnect is turned into copper oxide to a thickness of 30 nm or more by oxidation conducted at the oxidation rate of 20 nm/min or less, and thereafter formation of the dielectric layer as well as formation of the trench and the via hole are carried out.

BRIEF DESCRIPTION OF THE DRAWINGS

FIG. 6(a) represents a state in which the nitride film is overetched and FIG. 6(b); a state of the same section after a barrier film is formed.

DETAILED DESCRIPTION OF THE PREFERRED EMBODIMENTS

Figure 1:
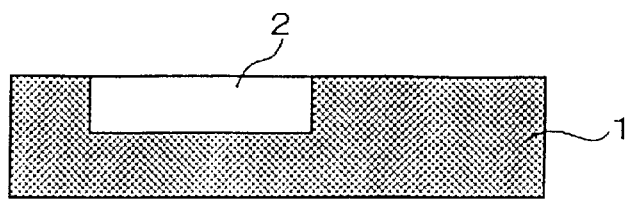
FIGS. 1(a)–1(f) is a series of schematic sectional views of the steps illustrating one embodiment of the manufacturing method of a semiconductor device according to the present invention.
Figure 1:
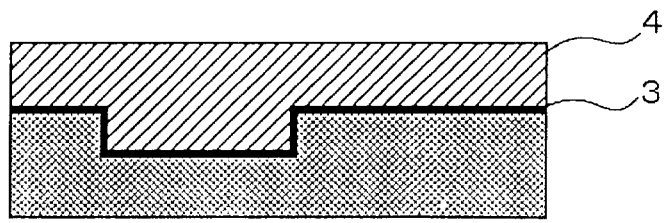
Figure 1:
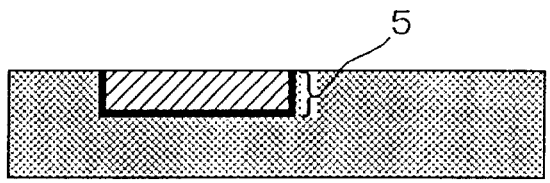
Figure 1:
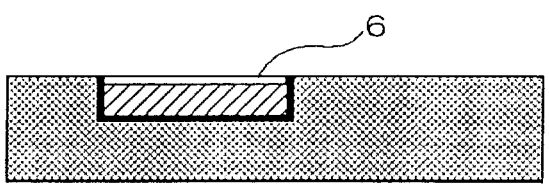
Figure 1:
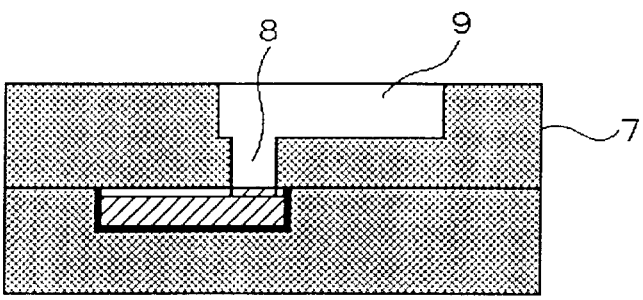
Figure 1:
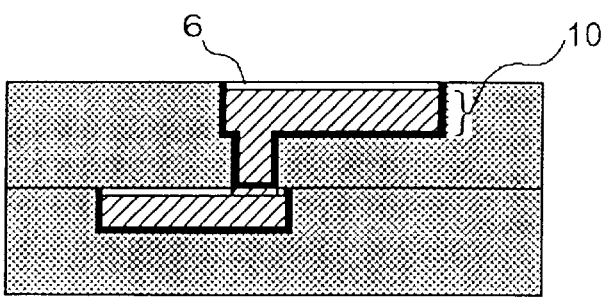

Referring to the drawings, the present invention is described in detail herein below.

FIG. 1 is a series of schematic sectional views of the steps in explaining a method of forming multiple levels of copper interconnects according to the present invention. A first interconnect trench (2) to form a copper interconnect through damascene metallization technique is formed on a first interlayer dielectric film (1) such as a silicon oxide film, by the means of photolithography using either the i-line (360 nm) or the Kr-F excimer laser (248 nm) (FIG. 1(a)). Next, a barrier metal layer (3) of TiN, Ta, TaN, WN or the like is formed over the entire surface by the sputtering method, the PVD (Physical Vapour Deposition) method, the CVD method or the like, and then a copper film (4) is grown thereon by the PVD method, the CVD method, the electroplating method or the like (FIG. 1(b)). Subsequently, polishing by the CMP method is applied thereto till the surface of the first interlayer dielectric film (1) is exposed, and thereby a first-level interconnect (5) is formed (FIG.1(c)). Next, in the oxygen plasma, the exposed surface of the copper interconnect is oxidized, preferably at the oxidation rate of 20 nm/min or less and more preferably at the oxidation rate of 10 nm/min or less so as to form an ARC (6) with a thickness of 30 nm or more (FIG. 1(d)). After a second-level interlayer dielectric film (7) is grown, a second interconnect trench (9) as well as a via hole (8) to bring out a contact with the first-level interconnect (5) are formed, in the similar manner, by means of photolithography (FIG. 1(e)). At this point, if the ARC being made of copper oxide and exposed at the bottom of the via hole (8) is left as it is, the contact resistance with an upper interconnect that is to be formed increases, which indicates the necessity of its removal. On the other hand, with respect to the copper oxide (cupric oxide) film formed hereat, it was confirmed that etching under the normal etching conditions (using fluorine containing gas) cannot bring about the thorough removal thereof. Accordingly, in the present invention, the following method is employed to prevent an increase in the contact resistance; namely, the exposed surface of the copper oxide is subjected to a heat treatment in the reductive atmosphere under the hydrogen flow or the like, for instance, a heat treatment conducted for 30 minutes at 400° C., under the flow of Ar mixed with 5% of $H_2$, under the condition that the pressure is 100 mTorr or less, and thereby an oxidized section thereof is reduced to copper. Since the oxidized section is not removed but reduced, this method has an additional effect that the resulting decrease in film thickness is very small. After this, in the same manner as described above, a barrier metal layer and a copper film are formed and the planarization by the CMP is applied thereto, and thereby a second-level interconnect (10) is accomplished. In case that another interconnect is required over this, the exposed surface of the copper interconnect is oxidized similarly and then a copper oxide film is formed as another ARC (6) (FIG. 1(f)).

Figure 3:
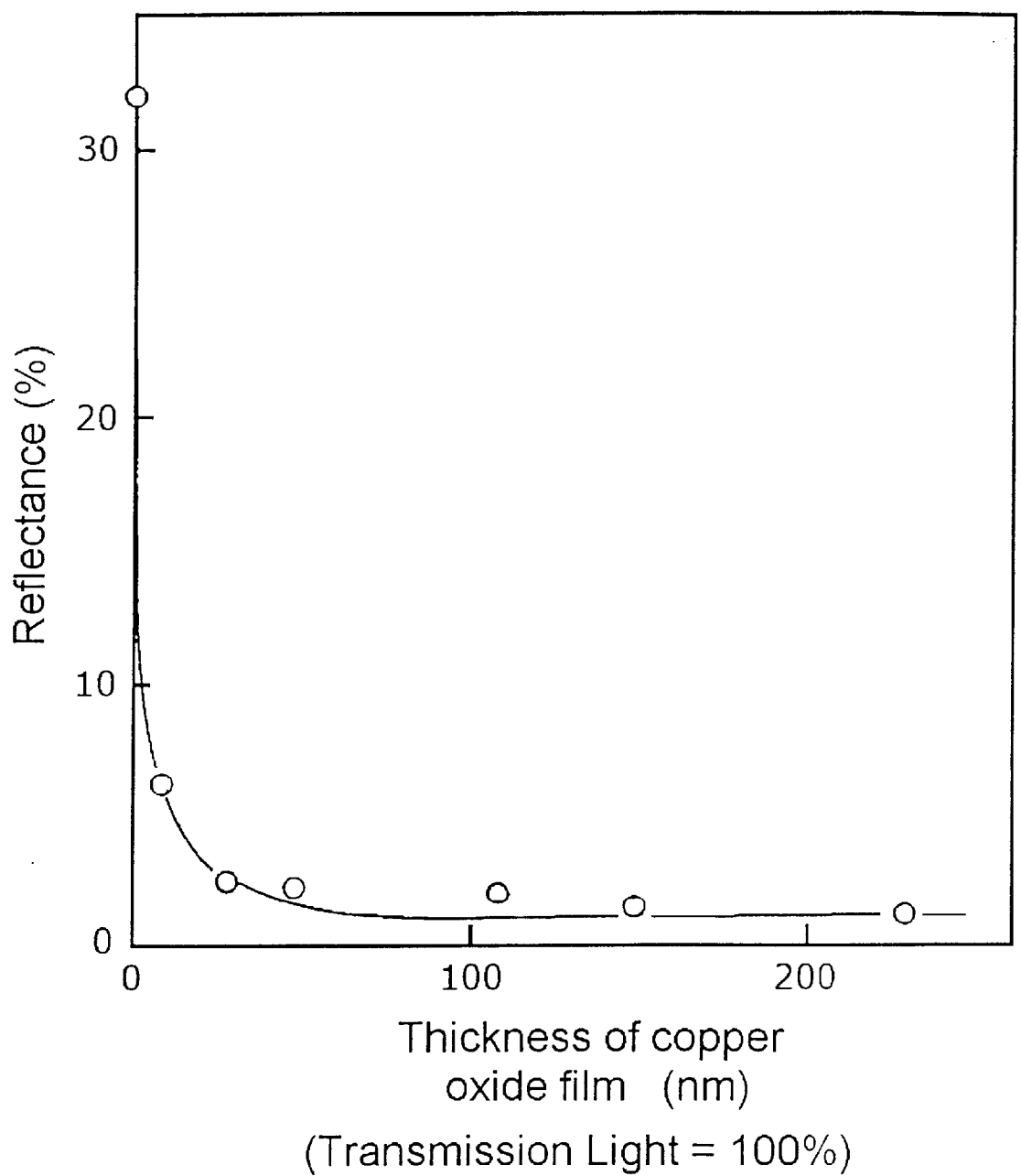
FIG. 3 is a graph showing an example of the dependence of the reflectance upon the film thickness of the copper oxide film.

With regard to the copper oxide film to be formed, it was found that the film thickness of 30 nm or more is enough to provide the anti-reflective effect, as clearly seen in FIG. 3. Further, the upper limit is not specifically defined, and the film thickness thereof can take any value as long as the interconnect resistance caused by that film is within a range acceptable to a given film thickness of the copper interconnect layer that is to be formed.

As for the conditions of the oxygen plasma treatment, preferably the pressure is 0.5 to 5.0 Torr, the amount of oxygen flow is 100 to 500 sccm (standard cubic centimeters per minute), the plasma power is 200 to 1000 W and the treatment time is 30 to 600 seconds. The substrate temperature at which the treatment is performed is 150° C. or less and more preferably 25 to 150° C.

Referring to the preferred embodiments, the present invention is further described in detail below.

First, using the plasma oxidation method, the change of the oxidation rate of copper was examined as the substrate temperature was varied. The measurement was made under fixed measuring conditions that the pressure was 3 Torr and the plasma power was 345 W.

Figure 2:
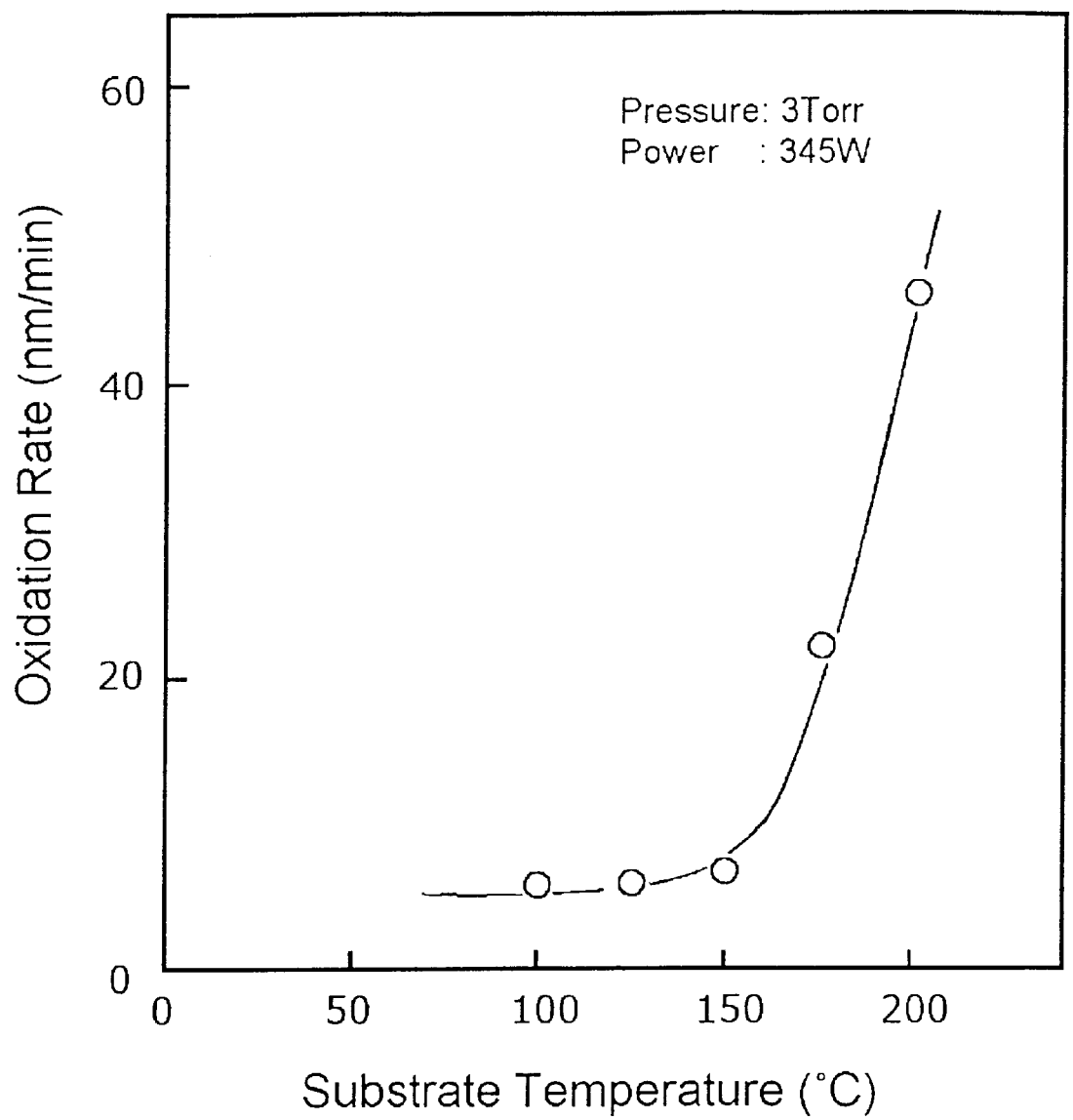
FIG. 2 is a graph showing an example of the dependence of the oxidation rate upon the substrate temperature.

As shown in FIG. 2, the oxidation rate rose rapidly above 150° C. In addition, especially when the oxidation rate exceeded 20 nm/min, the peeling-off of the film became marked.

Figure 4:
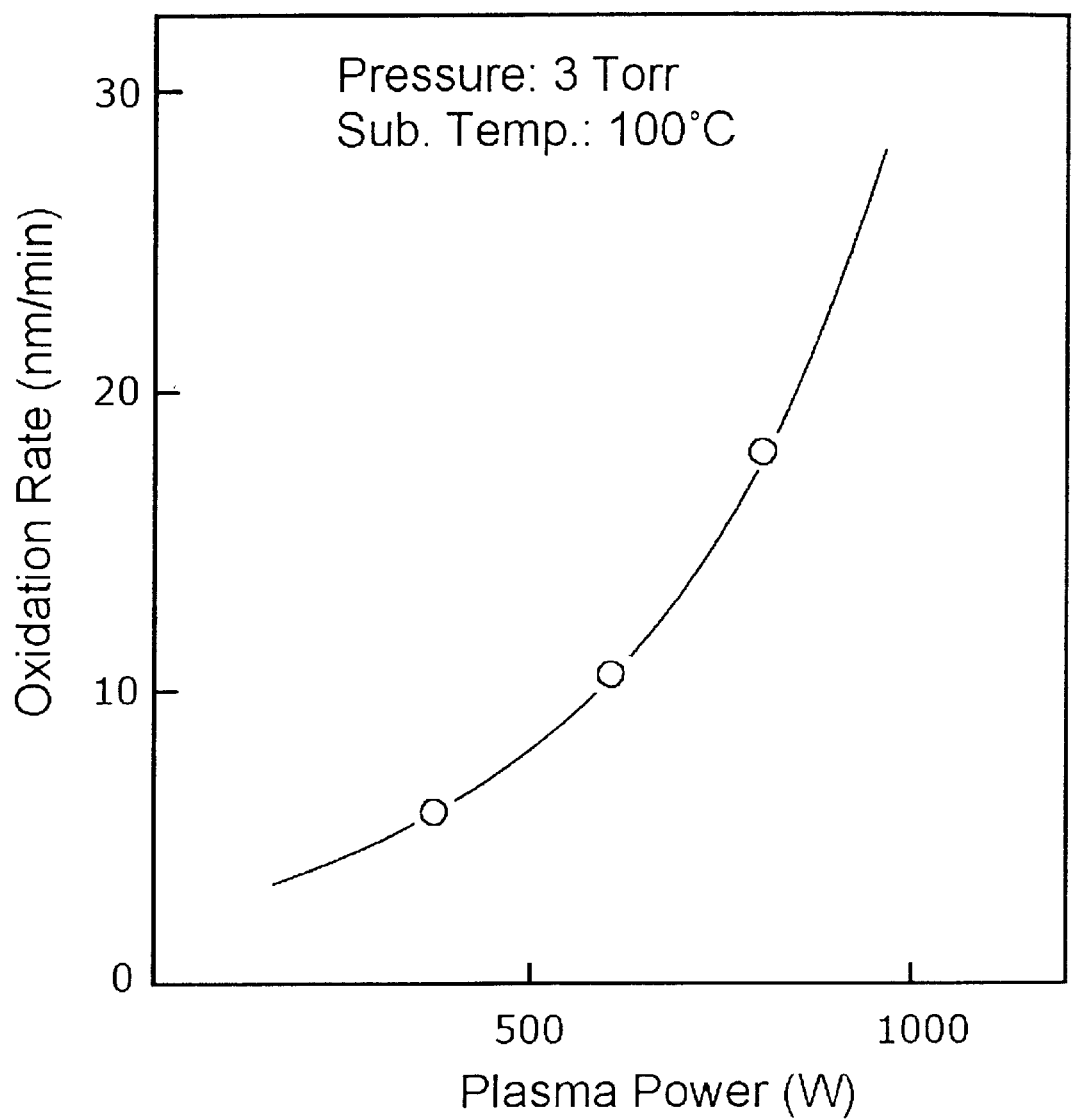
FIG. 4 is a graph showing an example of the dependence of the oxidation rate upon the plasma power.
Figure 5A:
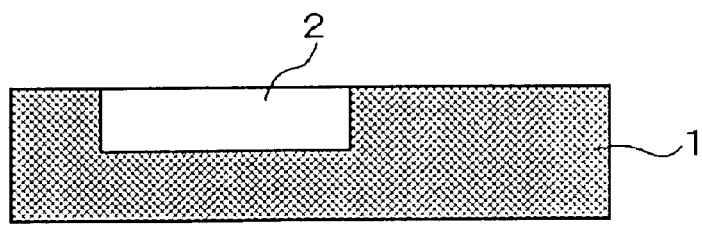
FIGS. 5(a)–5(e) is a series of schematic sectional views in explaining the steps of manufacturing multiple levels of copper interconnects according to the prior art.
Figure 5B:
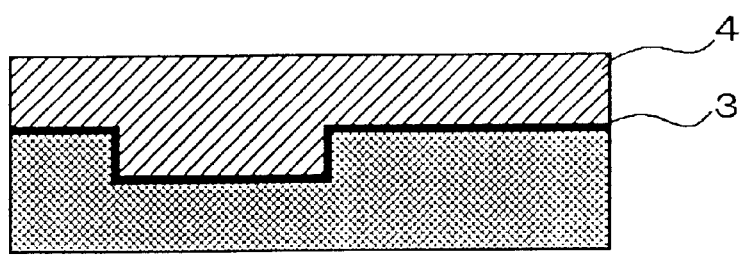
Figure 5C:
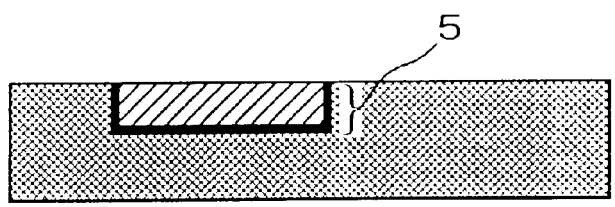
Figure 5D:
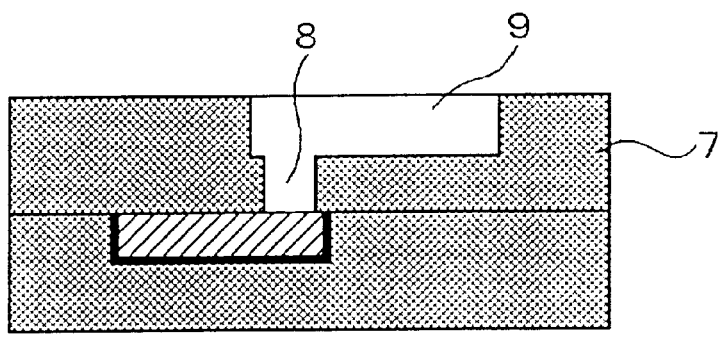
Figure 5E:
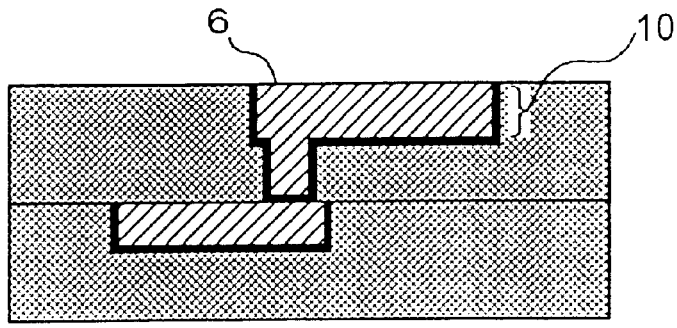
Figure 6A:
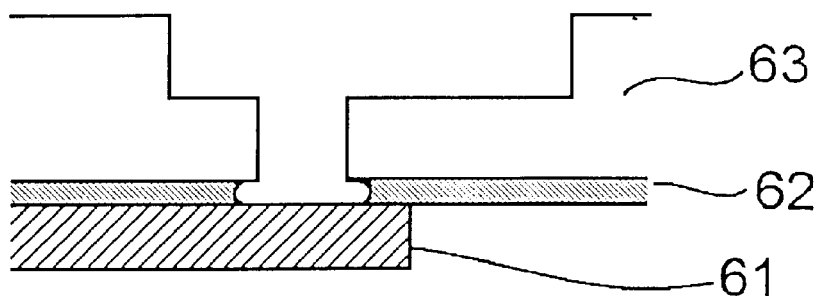
FIGS. 6(a) and 6(b) is a pair of schematic sectional views in explaining problems that arises at the time of removal of a nitride film formed as a conventional ARC.
Figure 6B:
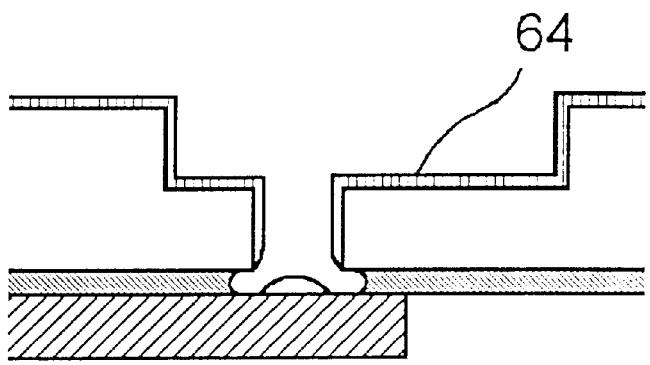

Next, the dependence of the oxidation rate upon the plasma power was studied. For the measuring conditions, the pressure and the substrate temperature were fixed at 3 Torr and 100° C., respectively, and the oxidation rates were measured when the plasma power was 345, 550 and 800 W. The results are shown in FIG. 4. The oxidation rate increases in proportion to the power, as FIG. 4 depicts. Further, from a graph of FIG. 2 mentioned above, it is evident that the rate of increase in the oxidation rate is low when the substrate temperature is set at a low temperature, and high, at a high temperature. Consequently, in the present invention, the substrate temperature and the power are preferably adjusted in such a way that the oxidation rate is 20 nm/min or less.

Next, the relation between the film thickness of the copper oxide film and the reflectance was investigated. The measurements of the reflectance were made by irradiating the laser beam with a wavelength of 260 nm onto the surface of the copper oxide film of various film thicknesses and each reflectance was detected through a spectrophotometer. The results are shown in FIG. 3. The reflectance of the copper surface over which no oxide was formed was 32%. The reflectance gradually decreased with increasing the film thickness of the oxide film, and went down to 2% when the film thickness was 30 nm. Little change was observed when the film thickness increased still further. The result indicates that the copper oxide film is effective, provided the film thickness thereof is 30 nm or more.

What is claimed is:

1. A semiconductor device including multiple levels of copper interconnects; wherein the surface of a copper interconnect corresponding to at least one underlying layer of another copper interconnect layer is turned into copper oxide having a thickness of approximately 30 nm or more by an oxidation conducted at an oxidation rate of around 20 nm/min or less.

2. The semiconductor device according to claim 1, wherein said copper oxide on the surface of said underlying layer of copper comprises cupric oxide.

3. The semiconductor device according to claim 2, wherein said copper oxide is formed by applying an oxygen plasma treatment to the exposed surface of the underlying layer of copper interconnect.

4. The semiconductor device according to claim 3, wherein the copper oxide formed on the surface of said underlying copper interconnect is reduced to copper in a reductive atmosphere, at least at a contact part with another copper interconnect formed as an upper-level interconnect, prior to the formation of the upper-level copper interconnect.

5. The semiconductor device according to claim 2, wherein the copper oxide formed on the surface of said underlying copper interconnect is reduced to copper in a reductive atmosphere, at least at a contact part with another copper interconnect formed as an upper-level interconnect, prior to the formation of the upper-level copper interconnect.

6. The semiconductor device according to claim 1, wherein the copper oxide formed on the surface of said underlying copper interconnect is reduced to copper in a reductive atmosphere, at least at a contact part with another copper interconnect formed as an upper-level interconnect, prior to the formation of the upper-level copper interconnect.

7. A semiconductor device comprising:

a plurality of copper interconnect layers separated by a plurality of dielectric layers;

at least a selected one of the plurality of copper interconnect layers located below an uppermost one of the plurality of copper interconnect layers having a surface of the copper interconnect covered by a copper oxide layer with a thickness of about 30 nm or more;

a selected one of the plurality of dielectric layers disposed over the selected copper interconnect layer located below the uppermost copper interconnect layer includes at least one trench substantially containing at least one damascene copper interconnect line and a via hole making contact with a selected portion of the selected one of the copper interconnect layers that is located below uppermost copper interconnect layer;

at least that portion of the copper oxide layer exposed by the via hole is one of removed and reduced to copper to provide electrical contact between the uppermost copper interconnect layer and the selected one of the plurality of copper interconnect layers located below the uppermost one of the plurality of copper interconnect layers.

8. The semiconductor device according to claim 7, wherein said copper oxide comprises cupric oxide.

9. The semiconductor device according to claim 8, wherein said copper oxide layer is formed by an oxygen plasma treatment to the exposed surface of the copper interconnect layer.

10. The semiconductor device according to claim 9, wherein the oxygen plasma treatment temperature is in the range of about 25 to 150° C.

11. The semiconductor device according to claim 9, wherein the plasma power at the is in the range of about 200 to 1000 W.

12. The semiconductor device according to claim 9, wherein copper oxide exposed by the via hole is reduced to copper in a reductive atmosphere.

* * * * *